United States Patent [19]
Akioka

[11] Patent Number: 6,108,234
[45] Date of Patent: Aug. 22, 2000

[54] SEMICONDUCTOR MEMORY DEVICE CAPABLE OF CARRYING OUT A READ-OUT OPERATION AT A HIGH SPEED

[75] Inventor: Toshiaki Akioka, Kanagawa, Japan

[73] Assignee: NEC Corporation, Tokyo, Japan

[21] Appl. No.: 09/281,282

[22] Filed: Mar. 30, 1999

[30] Foreign Application Priority Data

Mar. 31, 1998 [JP] Japan ................................. 10-085331

[51] Int. Cl.⁷ .................................................. G11C 11/34
[52] U.S. Cl. ..................................... 365/184; 365/189.04
[58] Field of Search ............................... 365/185.03, 82, 365/189.04, 185.23, 226, 184, 189.06, 189.05

[56] References Cited

U.S. PATENT DOCUMENTS

| | | | |
|---|---|---|---|
| 4,503,518 | 3/1985 | Iwahashi | 365/104 |
| 5,835,406 | 11/1998 | Chevallier et al. | 365/185.03 |
| 5,852,575 | 12/1998 | Sugiura et al. | 365/184 |
| 5,953,274 | 9/1999 | Iwahashi | 365/204 |

FOREIGN PATENT DOCUMENTS

| | | |
|---|---|---|
| 1-196162 | 8/1989 | Japan . |
| 4-174538 | 6/1992 | Japan . |
| 8-125143 | 5/1996 | Japan . |
| 10-11979 | 1/1998 | Japan . |

*Primary Examiner*—David Nelms
*Assistant Examiner*—Thong Le
*Attorney, Agent, or Firm*—McGinn & Gibb, P.C.

[57] ABSTRACT

A semicomductive memory device has a memory cell connected to a word line and a digit line. The memory cell is for memorizing data of two bits in correspondence to first through fourth threshold voltages. The first threshold voltage is lower than the second threshold voltage which is lower than the third threshold voltage. The third threshold voltage is lower than the fourth threshold voltage. The semicomductive memory device has a supplying section for selectively supplying first through third read-out voltages with the word line. The first read-out voltage has a value between the first and the second threshold voltages. The second read-out voltage has a value between the second and the third threshold voltages. The third read-out voltage has a value between the third and the second threshold voltages. The supplying section supplies the second read-out voltage to the word line at first. A reading section is connected to the digit line and reads the data out of the memory cell in accordance with the first through the third read-out voltages.

14 Claims, 5 Drawing Sheets

SEMICONDUCTOR MEMORY DEVICE CAPABLE OF CARRYING OUT A READ-OUT OPERATION AT A HIGH SPEED

BACKGROUND OF THE INVENTION

This invention relates to a semiconductive memory device, and more particularly, to a semiconductive memory device capable of carrying out a read-out operation at a high speed.

In general, a multivalued semiconductive memory device is known which memorizes digital data having at least two bits in a memory transistor. In a conventional multivalued semiconductive memory device, the digital data are defined in correspondence to threshold levels of the memory transistor. It will be assumed that the digital data has a lower datum and an upper datum. On carrying out a read-out operation, a read-out voltage is applied to the memory transistor in an ascending order from a lower voltage to a higher voltage in order to determine the digital data. The lower datum is determined at first and the upper datum is secondly determined when the read-out voltage is applied to the memory transistor in the ascending order from the lower voltage to the higher voltage.

However, it is difficult to carry out the read-out operation in the conventional multivalued semiconductive memory device at a high speed when the read-out voltage is applied to the memory transistor in the ascending order from the lower voltage to the higher voltage.

In order to carry out the read-out operation at the high speed, it is known that an improved multivalued semiconductive memory device comprises first and second reading sections which carry out a data reading operation and a data output operation by turns. In other words, the first reading section carries out the data reading operation when the second reading section carries out the data output operation. When the second reading section carries out the data reading operation, the first reading section carries out the data output operation.

However, the improved multivalued semiconductive memory device has a large size and increases a consumption of electric power inasmuch as the improved multivalued semiconductive memory device comprises first and second reading sections.

In addition, another multivalued semiconductive memory device is disclosed in Japanese Patent Publication Tokkai Hei 10-11979 (11979/1998). In the multivalued semiconductive memory device, first through third word line voltages are selectively supplied to a line in order to judge digital data memorized in the memory transistor. More particularly, the second word line voltage is firstly supplied to the word line. In accordance with a read-out result based on the second word line voltage, a selected one of the first and the third word line voltage is secondly supplied to the word line.

Inasmuch as the second word line voltage is firstly supplied to the word line and the selected one of the first and the third word line voltage is secondly supplied to the word lines in accordance with the read-out result based on the second word line voltage, it is difficult to carry out the read-out operation at the high speed.

SUMMARY OF THE INVENTION

It is an object of this invention to provide a multivalued semiconductive memory device capable of carrying out a read-out operation at a high speed.

It is another object of this invention to provide a multivalued semiconductive memory device having a small size.

Other objects of this invention will become clear as the description proceeds.

On describing the gist of this invention, it is possible to understand that a multivalued semiconductive memory device comprises a memory cell connected to a word line and a digit line for memorizing data of two bits in correspondence to first through fourth threshold voltages. The first threshold voltage is lower than the second threshold voltage which is lower than the third threshold voltage. The third threshold voltage is lower than the fourth threshold voltage.

According to this invention, the multivalued semiconductive memory device comprises supplying means for selectively supplying first through third read-out voltages with said word line, the first read-out voltage having a value between the first and the second threshold voltages, the second read-out voltage having a value between the second and the third threshold voltages, the third read-out voltage having a value between the third and the second threshold voltages, the supplying means supplying the second read-out voltage to the word line at first and reading means connected to the digit line for read the data out of the memory cell in accordance with the first through the third read-out voltages.

DESCRIPTION OF THE PREFERRED EMBODIMENT

Figure 1:
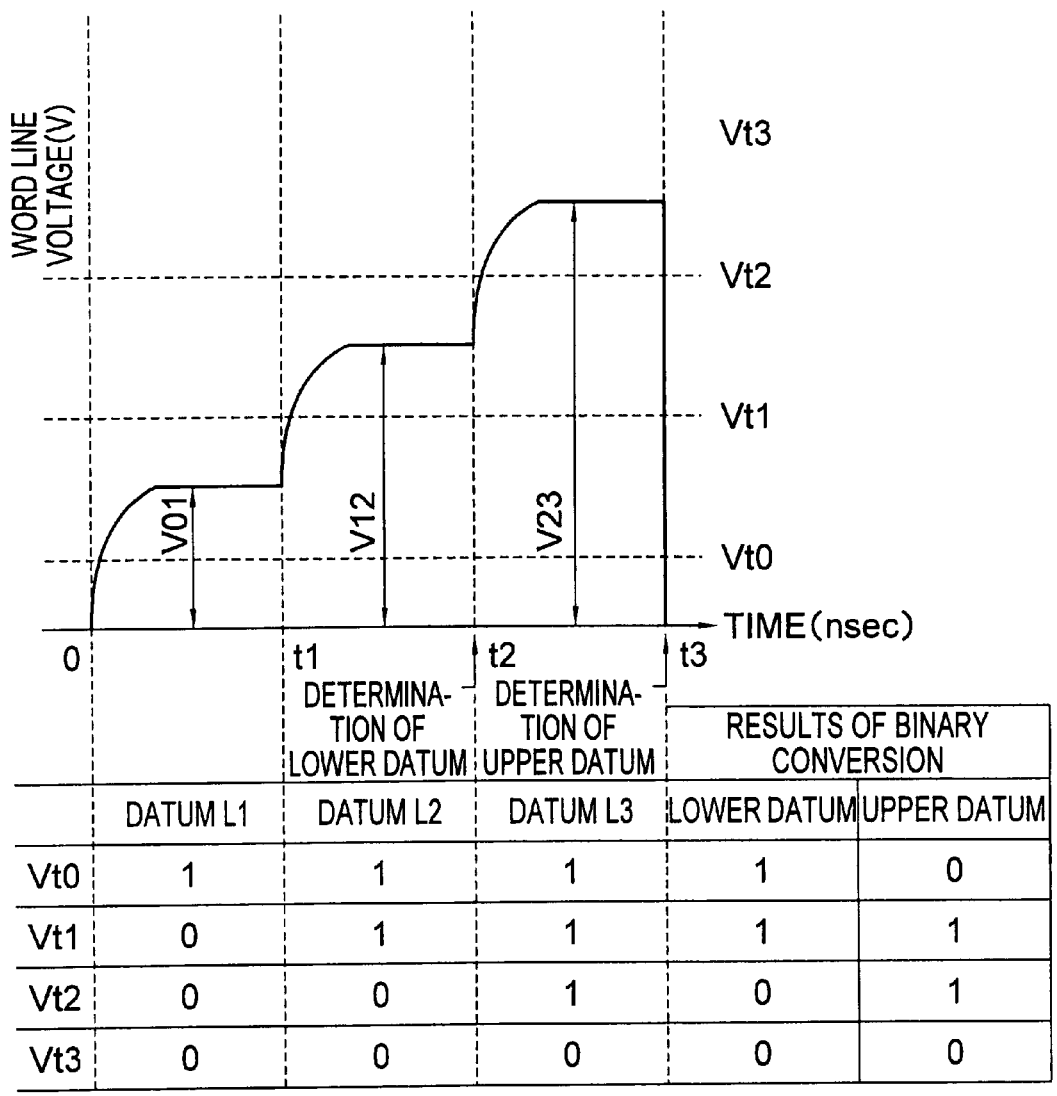
FIG. 1 shows a view for describing a read-out operation of a conventional multivalued semiconductive memory device.

Referring to FIG. 1, a first conventional multivalued semiconductive memory device will be described at first in order to facilitate an understanding of this invention. In the multivalued semiconductive memory device, a read-out voltage Vo is selectvively controlled to a first voltage V01, a second voltage V12, and a third voltage V23. The first voltage V01 is lower than the second voltage V12. The second voltage V12 is lower than the third voltage V23. The multivalued semiconductive memory device comprises a plurality of memory transistors (not shown) each of which has a first threshold voltage Vt0, a second threshold voltage Vt1, a third threshold voltage Vt2, and a fourth threshold voltage Vt3. The first voltage V01 has a value between the first threshold voltage Vt0 and the second threshold voltage Vt1. The second voltage V12 has a value between the second threshold voltage Vt1 and the third threshold voltage Vt2. The third voltage V23 has a value between the third threshold voltage Vt2 and the fourth threshold voltage Vt3.

On the read-out operation, the first voltage V01 is supplied to each of the memory transistors as the read-out voltage Vo till time t1(nsec.). The second voltage V12 is supplied to the each of the memory transistors as the read-out voltage Vo between time t1 and time t2(nsec.). The third voltage V23 is supplied to the each of the memory transistors as the read-out voltage Vo between time t2 and time t3(nsec.). The lower bit or datum is determined in each of the memory transistors after the time t2 lapses. The upper bit or datum is determined in each of the memory transistors after the time t3 lapses. Therefore, it takes the time t2 to determine the lower datum. It is difficult to satisfy a demanded specification. In other words, it is difficult to carry out the read-out operation at a high speed because the read-out voltage Vo is selectively controlled in an order from the first voltage V1 to the third voltage V23.

Figure 2:
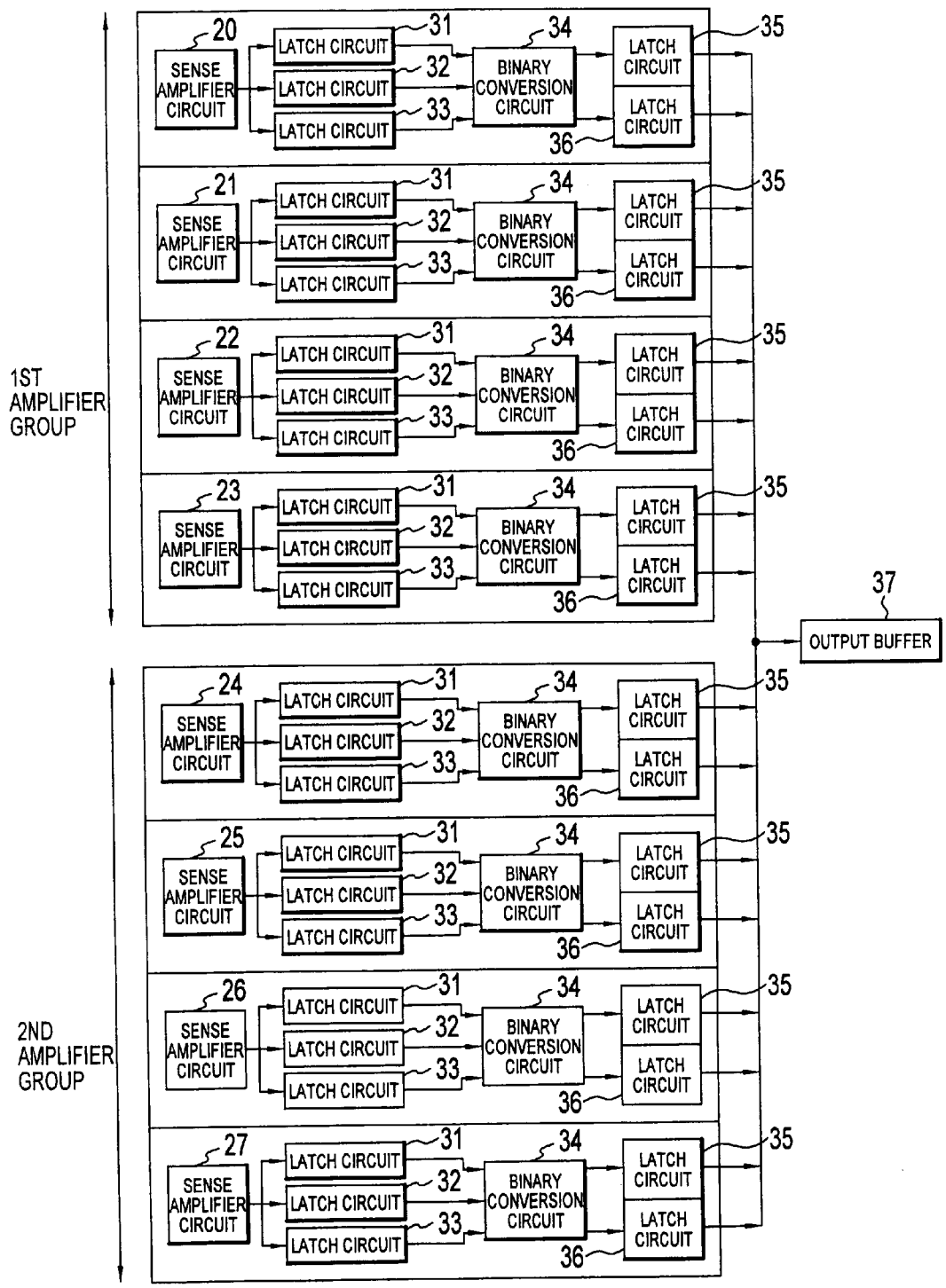
FIG. 2 is a block diagram of another conventional multivalued semiconductive memory device.

Referring to FIG. 2, description will be made as regards a second conventional multivalued semiconductive memory device. The illustrated multivalued semiconductive memory device comprises eight read-out circuits every one output bit. Each of the read-out circuits has first through eighth sense amplifiers 20 to 27. Furthermore, the multivalued semiconductive memory device comprises first through third latch circuits 31 to 33, a binary conversion circuit 34, and fourth and fifth latch circuits 35 and 36 in correspondence to each sense amplifier. The first latch circuit 31 latches a read-out result when the first voltage V01 is supplied as the read-out voltage to a word line. The second latch circuit 32 latches a read-out result when the second voltage V12 is supplied as the read-out voltage to the word line. The third latch circuit 33 latches a read-out result when the third voltage V23 is supplied as the read-out voltage to the word line. Supplied with the outputs of the first through the third latch circuits 31 to 33, the binary conversion circuit 34 carries out a binary conversion. The fourth and the fifth latch circuits 35 and 36 latch the output of the binary conversion circuit 34. The outputs of the fourth and the fifth latch circuits 35 and 36 are supplied to an output buffer 37 in each of the first through the eighth sense amplifiers 20 to 27.

In each of the read-out circuits, the first through the fourth sense amplifiers 20 to 23 belong to a first amplifier group. The fifth through the eighth sense amplifiers 24 to 27 belong to a second amplifier group. Each of the first and the second amplifier groups carries out previous read-out operation and data output operation by turns. More particularly, the latched data is in turns supplied from the fourth and the fifth latch circuits 35 and 36 of the second amplifier group to the output buffer 37 when the first through the fourth sense amplifiers 20 to 23 carry out the previous read-out operation in the first amplifier group. Similarly, the latched data is in turns supplied from the fourth and the fifth latch circuits 35 and 36 of the first amplifier group to the output buffer 37 when the first through the fourth sense amplifiers 20 to 23 carry out the previous read-out operation in the second amplifier group.

As readily understood from the above description, it is necessary to carry out the previous read-out operation in the second conventional multivalued semiconductive memory device in order to carry out the read-out operation at the high speed. In other words, it is necessary for the second conventional multivalued semiconductive memory device to have circuits for the previous read-out operation. As a result, the chip size becomes large in the second conventional multivalued semiconductive memory device. Furthermore, the consumption power increases in the second conventional multivalued semiconductive memory device.

Figure 3:
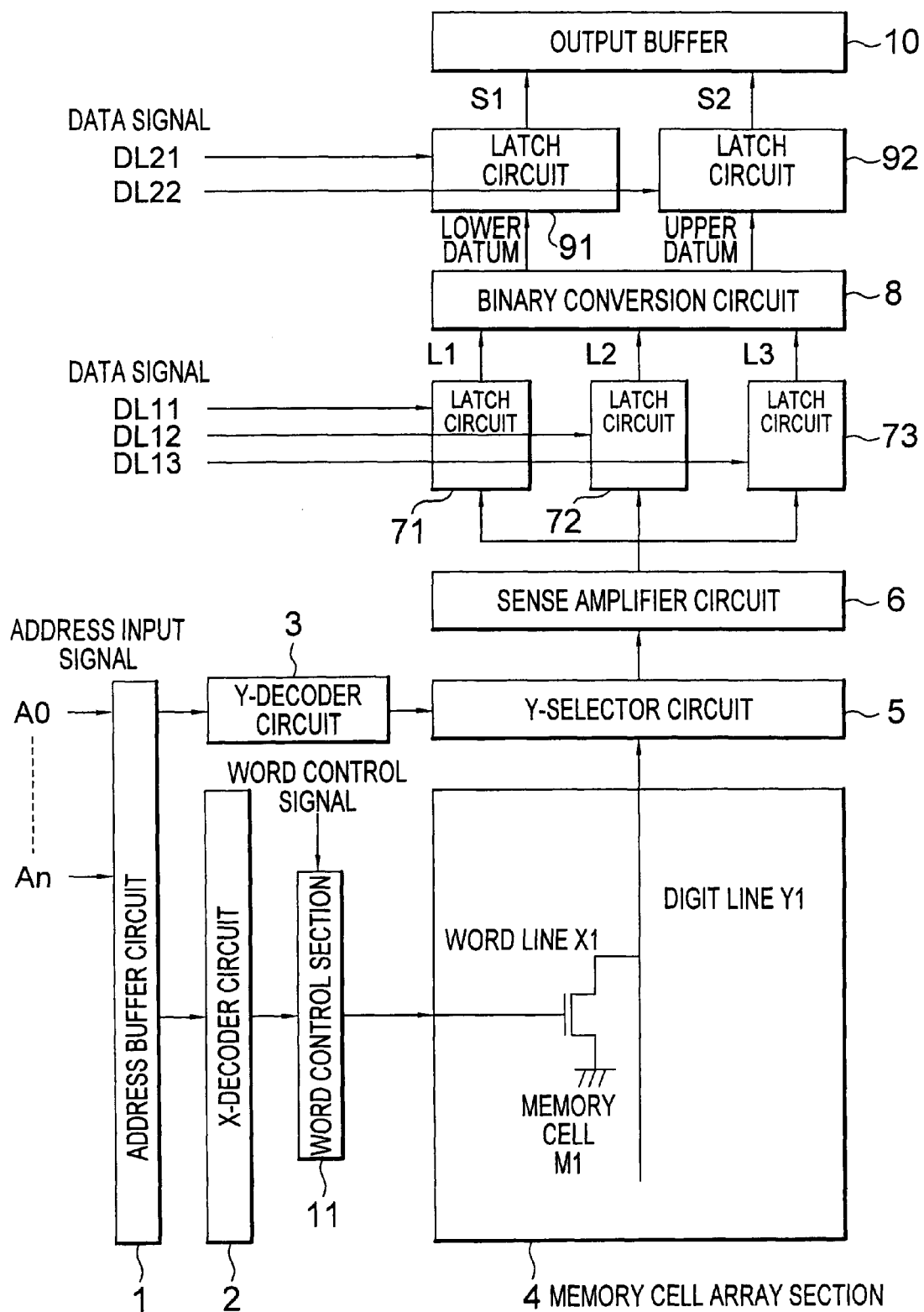
FIG. 3 is a block diagram of a multivalued semiconductive memory device according to a preferred embodiment of this invention.

Referring to FIG. 3, description will proceed to a multivalued semiconductive memory device according to a preferred embodiment of this invention. A read-only memory (ROM) will be described which is one of the multivalued semiconductive memory devices. The illustrated semiconductive memory device comprises an address buffer circuit 1, an X-decoder circuit 2, a Y-decoder circuit 3, a memory cell array section 4, a Y-selector circuit for selecting a digit line, and a word control section 11. Although only one read-out circuit section is illustrated in FIG. 3, the semiconductive memory device comprises four read-out circuit sections as will be described later. Each of the read-out circuit sections comprises a sense amplifier circuit 6, first through third latch circuits 71 to 73, a binary conversion circuit 8, and fourth and fifth latch circuits 91 and 92. The fourth and fifth latch circuits 91 and 92 are connected to the output buffer 10.

The memory cell array section 4 has a plurality of memory cells located in a matrix shape. As a matter of convenience, a selected memory M1 is only illustrated in FIG. 3. The gate of the selected memory cell M1 is connected to a word line X1 which is connected to the word control section 11. The drain of the selected memory cell M1 is connected to the digit line Y1 which is connected to the input terminal of the sense amplifier circuit 6 through the Y-selector circuit 5.

The first through the third latch circuits 71 to 73 carry out latch operations in accordance with first through third data latch signals DL11 to DL13, respectively. The first through the third latch circuits 71 to 73 are connected to the binary conversion circuit 8. The binary conversion circuit 8 is connected to the fourth and the fifth latch circuits 91 and 92. The fourth and the fifth latch circuits 91 and 92 carry out latch operations in accordance with fourth and fifth data latch signals DL21 and DL22, respectively. The outputs of the fourth and the fifth latch circuits 91 and 92 are supplied to the output buffer 10.

Figure 4:
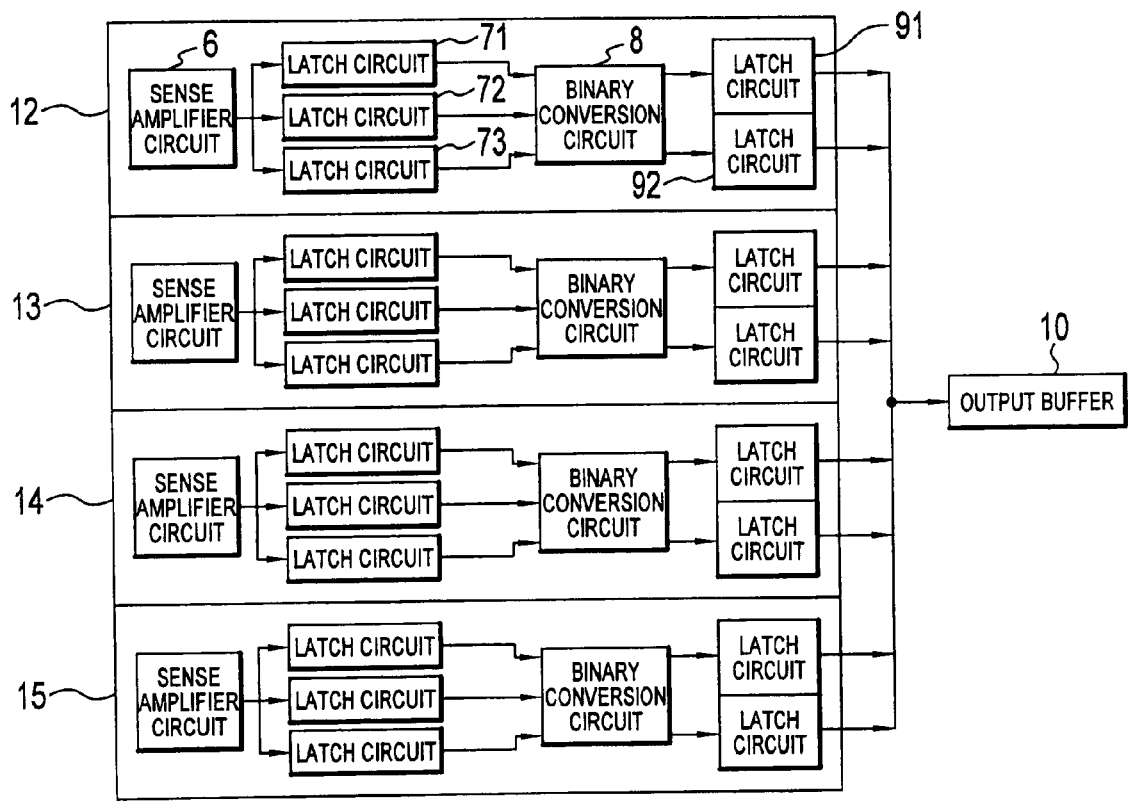
FIG. 4 is a block diagram of a reading section used in the multivalued semiconductive memory device illustrated in FIG. 3.

Referring to FIG. 4, the semiconductive memory device comprises first through fourth read-out circuit sections 12 to 15. In other words, the semiconductive memory device comprises four sense amplifier circuits 6 every one output bit. Each of the first through fourth read-out circuit sections 12 to 15 has the first through the third latch circuits 71 to 73 in correspondence to the sense amplifier circuit. The first through the third latch circuits 71 to 73 latch read-out results when a read-out voltage is applied to the word line. Furthermore, each of the first through fourth read-out circuit sections 12 to 15 has the binary conversion circuit 8 for carrying out the binary conversion of the outputs of the first through the third latch circuits 71 to 73. Each of the first through fourth read-out circuit sections 12 to 15 has the fourth and the fifth latch circuits 91 and 92 for latching the output of the binary conversion circuit 8.

Reviewing FIG. 3, the memory cell M1 memorizes one of two bit data "LL(00)", "LH(01)", "HL(10)", and "HH(11)". The memory cell M1 is a multivalued cell. It is possible to realize such a multivalued cell when four threshold voltages are set to the memory cell M1. It will be assumed that four threshold voltages are defined as first through fourth voltages $Vt0$ to $Vt3$ in the memory cell M1. The relationship of the first through the fourth threshold voltages is given by:

$Vt0 < Vt1 < Vt2 < Vt3$.

On reading data out of the memory cell M1, the word control section 11 supplies a read-out voltage Vo to the word line X1 on the basis of a word control signal and the output of the X-decoder circuit 2. It will be assumed that the read-out voltage Vo is a selected one of a first read-out voltage V01, a second read-out voltage V12, and a third read-out voltage V23. Taking the first through the fourth threshold voltages Vt0 to Vt3 into consideration, the relationship of the first through the third read-out voltages V01 to V23 is given by:

Vt0<V01<Vt1<V12<Vt2<V23<Vt3.

Figure 5:
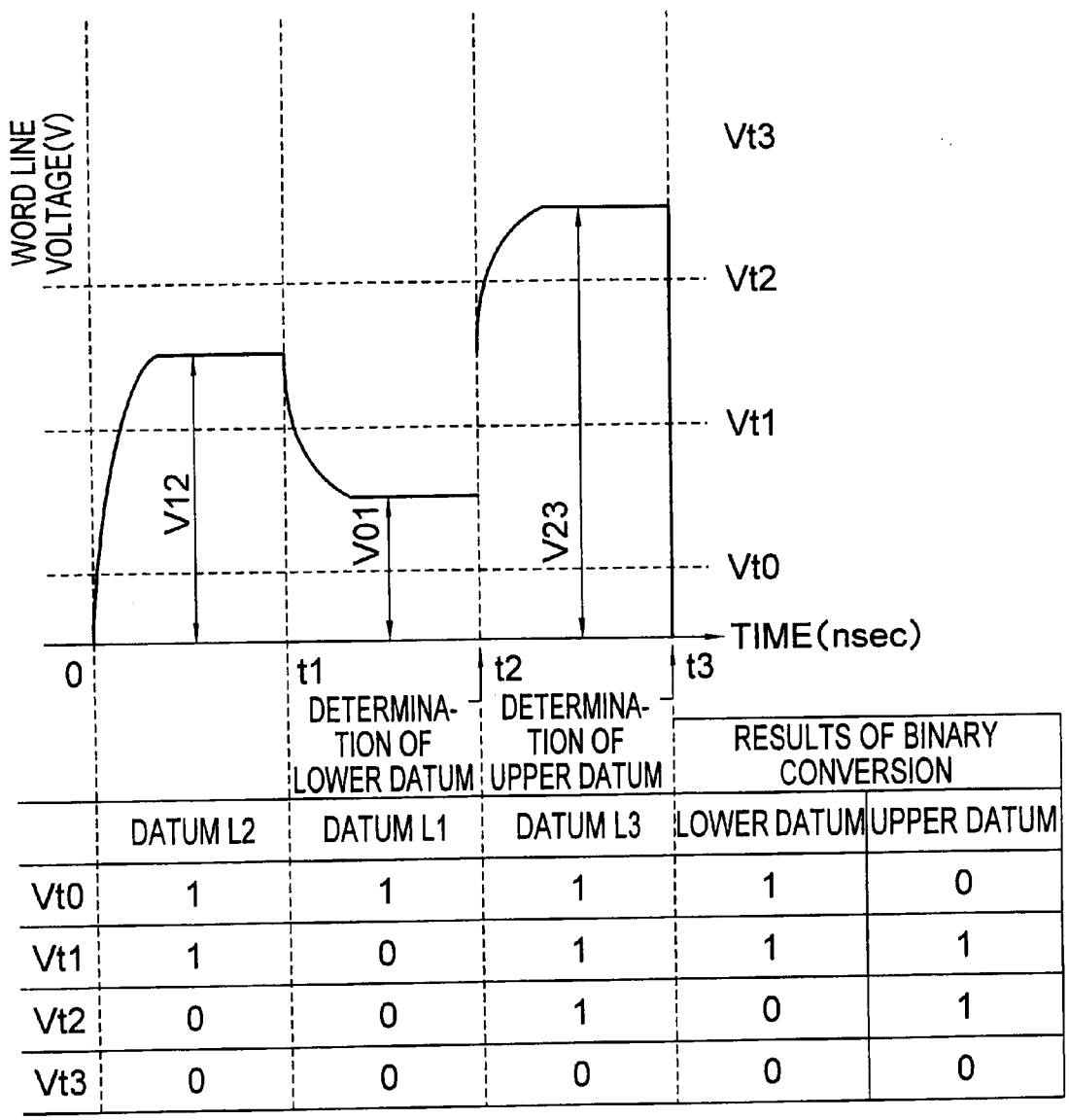
FIG. 5 shows a view for describing a read-out operation of the multivalued semiconductive memory device illustrated in FIG. 3.

Referring to FIG. 5 in addition to FIGS. 3 and 4, description will be made about the read-out operation of the semiconductive memory device illustrated in FIG. 3. In the example being illustrated, the read-out voltage Vo is controlled in an order of the second read-out voltage V12, the first read-out voltage V01, the third read-out voltage V23 on carrying out the read-out operation.

At a zeroth time "0(nsec.)", the word control section 11 controls the read-out voltage Vo to the second read-out voltage V12. The word control section 11 holds the the read-out voltage Vo to the second read-out voltage V12 till a first time "t1(nsec.)". During a first time duration between the zeroth time and the first time, the sense amplifier circuit 6 carries out the read-out operation to supply the read-out data to the first through the third latch circuits 71 to 73 which latch the read-out data as latched data therein. The latched data is converted into a binary value by the binary conversion circuit 8 to be outputted as a lower datum. The lower datum is latched in the fourth latch circuit 91 to be supplied as a datum S1 to the output buffer 10.

It will be assumed that the selected memory cell M1 has either one of the first and the second threshold voltages Vto and Vt1. Inasmuch as Vto<V12 or Vt1<V12, the memory cell M1 becomes an on-bit. As a result, a datum L2 becomes a high level "H". It will be assumed that the selected memory cell M1 has either one of the third and the fourth threshold voltages Vt2 and Vt3. Inasmuch as V12<Vt2 or V12<Vt3, the memory cell M1 becomes an off-bit. As a result, the datum L2 becomes a low level "L".

When the datum L2 is the high level "H", the lower datum becomes the high level "H". When the datum L2 is the low level "L", the lower datum becomes the low level "L". When the read-out voltage Vo is controlled to the second read-out voltage V12 on carrying out the read-out operation, the lower datum is determined at the first time "t1(nsec.)".

During a second time duration between the first time "t1(nsec.)" and a second time "t2(nsec.)", the word control section 11 controls the read-out voltage Vo to the first read-out voltage V01. During the second time duration, the sense amplifier circuit 6 carries out the read-out operation. It will be assumed that the selected memory cell M1 has the first threshold voltage Vto. Inasmuch as Vto<V01, the memory cell M1 becomes the on-bit. As a result, a datum L1 becomes the high level "H". It will be assumed that the selected memory cell M1 has either one of the second through the fourth threshold voltages Vt1 to Vt3. Inasmuch as V01<Vt1, V01<Vt2, or V01<Vt3, the memory cell M1 becomes the off-bit. As a result, the datum L1 becomes the low level "L".

During a third time duration between the second "t2 (nsec.)" and a third time "t3(nsec.)", the word control section 11 controls the read-out voltage Vo to the third read-out voltage V23. During the third time duration, the sense amplifier circuit 6 carries out the read-out operation in order to latch the read-out data as the latched data in the first through the third latch circuits 71 to 73.

It will be assumed that the selected memory cell M1 has either one of the first through the third threshold voltages Vt0 to Vt2. Inasmuch as Vto<V23, Vt1<V23, or Vt2<V23, the memory cell M1 becomes the on-bit. As a result, a datum L3 becomes the high level "H". It will be assumed that the selected memory cell M1 has fourth threshold voltage Vt3. Inasmuch as V23<Vt3, the memory cell M1 becomes the off-bit. As a result, the datum L3 becomes the low level "L".

As readily understood from the above description, the data L1 to L3 are latched at the third time "t3(nsec.)". As a result, an upper datum is determined by binary conversion circuit 8 to be supplied as a datum S2 to the output buffer 10.

It is possible to make a read-out time for the lower datum reduce t2−t1(nsec.) in the illustrated example without increasing the chip size and the consumption power.

Although the word control section 11 controls the read-out voltage Vo in the order of the second read-out voltage V12, the first read-out voltage V01, and the third read-out voltage V23 in the illustrated example, the word control section 11 may control the read-out voltage Vo in an order of the second read-out voltage V12, the third read-out voltage V23, and the first read-out voltage V01.

While this invention has thus far been described in conjunction with the preferred embodiment thereof, it will readily be possible for those skilled in the art to put this invention into practice in various other manners.

What is claimed is:

1. A semiconductor memory device comprising:
    a memory cell connected to a word line and a digit line for storing data of two bits in correspondence to first through fourth threshold voltages, said first threshold voltage being lower than said second threshold voltage which is lower than said third threshold voltage, said third threshold voltage being lower than said fourth threshold voltage;
    supplying means for selectively supplying first through third read-out voltages to said word line, said first read-out voltage has a value between said first and said second threshold voltages, said second read-out voltage has a value between said second and said third threshold voltages, said third read-out voltage has a value between said third and said fourth threshold voltages, said supplying means supplying said second read-out voltage to said word line prior to supplying said first read-out voltage to said word line and prior to supplying said third read-out voltage to said word line; and
    reading means connected to said digit line for reading said data out of said memory cell in accordance with said first through said third read-out voltages.

2. A semiconductor memory device as claimed in claim 1, wherein said supplying means supplies a word line voltage to said memory cell in an order of said second read-out voltage, said first read-out voltage, and said third read-out voltage.

3. A semiconductor memory device as claimed in claim 2, wherein:
    said second read-out voltage is supplied to said memory cell during a first time duration between zero and a first time;
    said first read-out voltage being supplied to said memory cell during a second time duration between said first time and a second time;
    said third read-out voltage being supplied to said memory cell during a third time duration between said second time and a third time;
    said reading means comparing the voltage of said word line with the threshold voltage of said memory cell at each of said first through said third times to obtain a judgement result representative of either one of high and low levels, said reading means latching said judgement result as latched data therein.

4. A semiconductor memory device as claimed in claim 3, wherein said semiconductor memory device further comprises binary conversion means for carrying out a binary conversion of said latched data to determine upper and lower data.

5. A semiconductor memory device as claimed in claim 1, wherein said supplying means supplies a word line voltage to said memory cell in an order of said second read-out voltage, said third read-out voltage, and said first read-out voltage.

6. A semiconductor memory device as claimed in claim 5, wherein:
   said second read-out voltage is supplied to said memory cell during a first time duration between zero and a first time;
   said third read-out voltage being supplied to said memory cell during a second time duration between said first time and a second time;
   said first read-out voltage being supplied to said memory cell during a third time duration between said second time and a third time;
   said reading means comparing the voltage of said word line with the threshold voltage of said memory cell at each of said first through said third times to obtain a judgement result representative of either one of high and low levels, said reading means latching said judgement result as latched data therein.

7. A semiconductor memory device as claimed in claim 6, wherein said semiconductor memory device further comprises binary conversion means for carrying out a binary conversion of said latched data to determine upper and lower data.

8. A semiconductor memory device comprising:
   a memory cell connected to a word line and a digit line for storing data of two bits in correspondence to first through fourth threshold voltages, said first threshold voltage being lower than said second threshold voltage, said second threshold voltage being lower than said third threshold voltage, said third threshold voltage being lower than said fourth threshold voltage;
   a supplying device connected to said word line, the supplying device selectively supplying first through third read-out voltages to said word line, said first read-out voltage having a value between said first and said second threshold voltages, said second read-out voltage having a value between said second threshold voltage and said third threshold voltages, said third read-out voltage having a value between said third threshold voltage and said fourth threshold voltages, said supplying device supplying said second read-out voltage to said word line prior to supplying said first read-out voltage to said word line; and
   a reading device connected to said digit line, the reading device reading said data out of said memory cell in accordance with said first through said third read-out voltages.

9. A semiconductor memory device as claimed in claim 8, wherein said supplying device supplies a word line voltage to said memory cell in an order of said second read-out voltage, said first read-out voltage, and said third read-out voltage.

10. A semiconductor memory device as claimed in claim 9, wherein:
    said second read-out voltage is supplied to said memory cell during a first time duration between zero and a first time;
    said first read-out voltage being supplied to said memory cell during a second time duration between said first time and a second time;
    said third read-out voltage being supplied to said memory cell during a third time duration between said second time and a third time;
    said reading device comparing the voltage of said word line with the threshold voltage of said memory cell at each of said first through said third times to obtain a judgement result representative of either one of high and low levels, said reading device latching said judgement result as latched data therein.

11. A semiconductor memory device as claimed in claim 10, wherein said semiconductor memory device further comprises a binary conversion device that carries out a binary conversion of said latched data to determine upper and lower data.

12. A semiconductor memory device as claimed in claim 8, wherein said supplying device supplies a word line voltage to said memory cell in an order of said second read-out voltage, said third read-out voltage, and said first read-out voltage.

13. A semiconductor memory device as claimed in claim 12, wherein:
    said second read-out voltage is supplied to said memory cell during a first time duration between zero and a first time;
    said third read-out voltage being supplied to said memory cell during a second time duration between said first time and a second time;
    said first read-out voltage being supplied to said memory cell during a third time duration between said second time and a third time;
    said reading device comparing the voltage of said word line with the threshold voltage of said memory cell at each of said first through said third times to obtain a judgement result representative of either one of high and low levels, said reading device latching said judgement result as latched data therein.

14. A semiconductor memory device as claimed in claim 13, wherein said semiconductor memory device further comprises a binary conversion device that carries out a binary conversion of said latched data to determine upper and lower data.

* * * * *